(12) United States Patent
Shimizu

(10) Patent No.: US 10,199,435 B2
(45) Date of Patent: Feb. 5, 2019

(54) LIGHT EMITTING ELEMENT AND DISPLAY DEVICE

(71) Applicant: Sony Corporation, Tokyo (JP)

(72) Inventor: Kan Shimizu, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/569,804

(22) PCT Filed: Mar. 18, 2016

(86) PCT No.: PCT/JP2016/058760
§ 371 (c)(1),
(2) Date: Oct. 27, 2017

(87) PCT Pub. No.: WO2016/185781
PCT Pub. Date: Nov. 24, 2016

(65) Prior Publication Data
US 2018/0145115 A1   May 24, 2018

(30) Foreign Application Priority Data

May 15, 2015 (JP) .................................. 2015-099612

(51) Int. Cl.
*H01L 33/00* (2010.01)
*H01L 27/32* (2006.01)
(Continued)

(52) U.S. Cl.
CPC ............ *H01L 27/3211* (2013.01); *G09F 9/30* (2013.01); *H01L 21/02107* (2013.01);
(Continued)

(58) Field of Classification Search
CPC .................... H01L 27/1248; H01L 27/3257
See application file for complete search history.

(56) References Cited

U.S. PATENT DOCUMENTS

2004/0169468 A1* 9/2004 Peng .................. H01L 27/3283
313/512
2006/0049753 A1* 3/2006 Kang ..................... H01L 51/56
313/506
(Continued)

FOREIGN PATENT DOCUMENTS

JP   2004-063359 A   2/2004
JP   2008-243545 A   10/2008
(Continued)

*Primary Examiner* — Thao P Le
(74) *Attorney, Agent, or Firm* — Michael Best & Friedrich LLP

(57) ABSTRACT

A light emitting element and display device are disclosed. In one example, a light emitting element includes a first electrode formed on a base body. A first insulation layer is formed on the base body and the first electrode and has an aperture portion in which a part of the first electrode is exposed. A second insulation layer is formed on the first insulation layer and has a protruding end portion protruding from the aperture portion. A third insulation layer is formed on the second insulation layer and has an end portion recessed from the protruding end portion. A charge injection/transport layer is formed over the second insulation layer and the third insulation layer. An organic layer includes a light emitting layer, and a second electrode formed on the organic layer. At least a part of the charge injection/transport layer is discontinuous at the protruding end portion.

20 Claims, 12 Drawing Sheets

(51) Int. Cl.
  *G09F 9/30* (2006.01)
  *H05B 33/12* (2006.01)
  *H01L 21/02* (2006.01)
  *H01L 51/50* (2006.01)
  *H01L 51/52* (2006.01)

(52) U.S. Cl.
  CPC .......... *H01L 27/32* (2013.01); *H01L 51/5056* (2013.01); *H05B 33/12* (2013.01); *H01L 51/5203* (2013.01)

(56) References Cited

U.S. PATENT DOCUMENTS

| | | | | |
|---|---|---|---|---|
| 2012/0223342 A1* | 9/2012 | Tanada | ................ | H01L 27/3204 257/88 |
| 2013/0234120 A1* | 9/2013 | Kakinuma | .............. | H01L 27/32 257/40 |
| 2015/0236295 A1* | 8/2015 | Lim | ................... | H01L 51/5218 257/40 |
| 2015/0357388 A1* | 12/2015 | Pang | ................... | H01L 27/3223 257/40 |
| 2018/0040774 A1* | 2/2018 | Lee | ........................ | H01L 33/46 |

FOREIGN PATENT DOCUMENTS

| | | |
|---|---|---|
| JP | 2009-545117 A | 12/2009 |
| JP | 2011-216267 A | 10/2011 |
| JP | 2012-216324 A | 11/2012 |
| JP | 2014-232631 A | 12/2014 |

\* cited by examiner

LIGHT EMITTING ELEMENT AND DISPLAY DEVICE

TECHNICAL FIELD

The present disclosure relates to a light emitting element and a display device.

BACKGROUND ART

In recent years, as a display device substituted for a liquid crystal display device, an organic electroluminescence display device (hereinafter, also simply abbreviated as an "organic EL display device") using an organic electroluminescence element (hereinafter, also simply abbreviated as an "organic EL element") has attracted attention. The organic EL display device is a self-luminous type, has a characteristic of low power consumption, and is considered to have sufficient responsiveness even to a high-definition high-speed video signal. Development and commercialization of the organic EL display device for practical use are keenly proceeding.

In the organic EL display device, high contrast and high color reproducibility can be realized, for example, by constituting one pixel with three sub-pixels (light emitting elements) constituted by a sub-pixel having a red light emitting layer and constituted by a light emitting element that emits red light, a sub-pixel having a green light emitting layer and constituted by a light emitting element that emits green light, and a sub-pixel having a blue light emitting layer and constituted by a light emitting element that emits blue light. Meanwhile, reduction of a pixel pitch is required for high resolution. However, it becomes more difficult to constitute one pixel with such three sub-pixels as the pixel pitch becomes finer.

Therefore, development of a method for forming a white light emitting layer over all pixels and coloring white light using a color filter, that is, development of technology for constituting one pixel with three sub-pixels of a red sub-pixel (referred to as a "red light emitting element") obtained by combining a light emitting element having a white light emitting layer (referred to as a "white light emitting element") and a red color filter, a green sub-pixel (referred to as a "green light emitting element") obtained by combining a white light emitting element and a green color filter, and a blue sub-pixel (referred to as a "blue light emitting element") obtained by combining a white light emitting element and a blue color filter is proceeding. The white light emitting layer is formed as a continuous layer over the entire white light emitting element. It is unnecessary to form the red light emitting layer, the green light emitting layer, and the blue light emitting layer for each sub-pixel. Therefore, the pixel pitch can be fine. In each white light emitting element, the white light emitting layer is formed between a first electrode and a second electrode. The first electrode is formed independently in each light emitting element. Meanwhile, the second electrode is common in each light emitting element.

In such a configuration, a phenomenon that a leakage current flows between a first electrode of a certain light emitting element and a second electrode constituting a light emitting element (referred to as an "adjacent light emitting element" for convenience) adjacent to the certain light emitting element may occur. In addition, when such a phenomenon occurs, light emission occurs in a light emitting element which should not emit light originally. Meanwhile, a current in a light emitting element which should emit light is reduced. As a result, blurring occurs in an image, and the chromaticity of the entire pixels may be shifted from desired chromaticity disadvantageously.

A means for solving such a problem is known, for example, from Japanese Patent Application Laid-open No. 2014-232631. A display device disclosed in this patent publication includes, successively from a substrate side, a plurality of first electrodes each formed in each pixel, and apertures respectively opposed to the plurality of first electrodes. The display device further includes an insulation layer having covers on edge portions of the apertures, a charge injection/transport layer which is cut at the covers of the insulation layer or the resistance of which is increased and indicating at least one of a charge injection property and a charge transport property, an organic layer including one or more light emitting layers common in all the pixels, and a second electrode formed over the entire surface of the organic layer.

CITATION LIST

Patent Document

Patent Document 1: Japanese Patent Application Laid-Open No. 2014-232631

SUMMARY OF THE INVENTION

Problems to be Solved by the Invention

As described above, in the display device disclosed in the above patent publication, the charge injection/transport layer is cut at covers of the insulation layer or the resistance thereof is increased, and therefore a phenomenon that a leakage current flows between a first electrode of a certain light emitting element and a second electrode constituting an adjacent light emitting element hardly occurs. However, in some cases, even in such a configuration, prevention of generation of a leakage current may be insufficient.

Therefore, an object of the present disclosure is to provide a light emitting element having a configuration and a structure in which a phenomenon that a leakage current flows between a first electrode in a certain light emitting element and a second electrode constituting an adjacent light emitting element hardly occurs, and a display device constituted by the light emitting element.

Solutions to Problems

The light emitting element of the present disclosure for achieving the above object includes:

a first electrode formed on a base body;

a first insulation layer formed on the base body and the first electrode and having an aperture portion in which a part of the first electrode is exposed;

a second insulation layer formed on the first insulation layer and having a protruding end portion protruding from the aperture portion disposed in the first insulation layer;

a third insulation layer formed on the second insulation layer and having an end portion recessed from the protruding end portion of the second insulation layer;

a charge injection/transport layer formed over the second insulation layer and the third insulation layer from the first electrode;

an organic layer formed on the charge injection/transport layer and including a light emitting layer formed of an organic light emitting material; and a second electrode formed on the organic layer, and at least apart of the charge injection/transport layer is discontinuous at the protruding end portion of the second insulation layer.

In order to achieve the above object, the display device of the present disclosure is formed of a plurality of the above light emitting elements of the present disclosure arranged in a two-dimensional matrix.

Effects of the Invention

In the light emitting element of the present disclosure or a light emitting element constituting the display device of the present disclosure (hereinafter, these light emitting elements are collectively referred to as a "light emitting element or the like of the present disclosure" for convenience), the protruding end portion protruding from the aperture portion (that is, the protruding end portion protruding from the first insulation layer and the third insulation layer) is disposed in the second insulation layer sandwiched by the first insulation layer and the third insulation layer. Therefore, at least a part of the charge injection/transport layer formed over the second insulation layer and the third insulation layer from the first electrode is reliably discontinuous at the protruding end portion. That is, the charge injection/transport layer is reliably cut at the protruding end portion of the second insulation layer or the resistance thereof is increased, and therefore occurrence of a phenomenon that a leakage current flows between a first electrode of a certain light emitting element and a second electrode constituting an adjacent light emitting element can be reliably prevented. Note that effects described herein are merely illustrative, and are not restrictive. In addition, an additional effect may be present.

MODE FOR CARRYING OUT THE INVENTION

Figure 1:
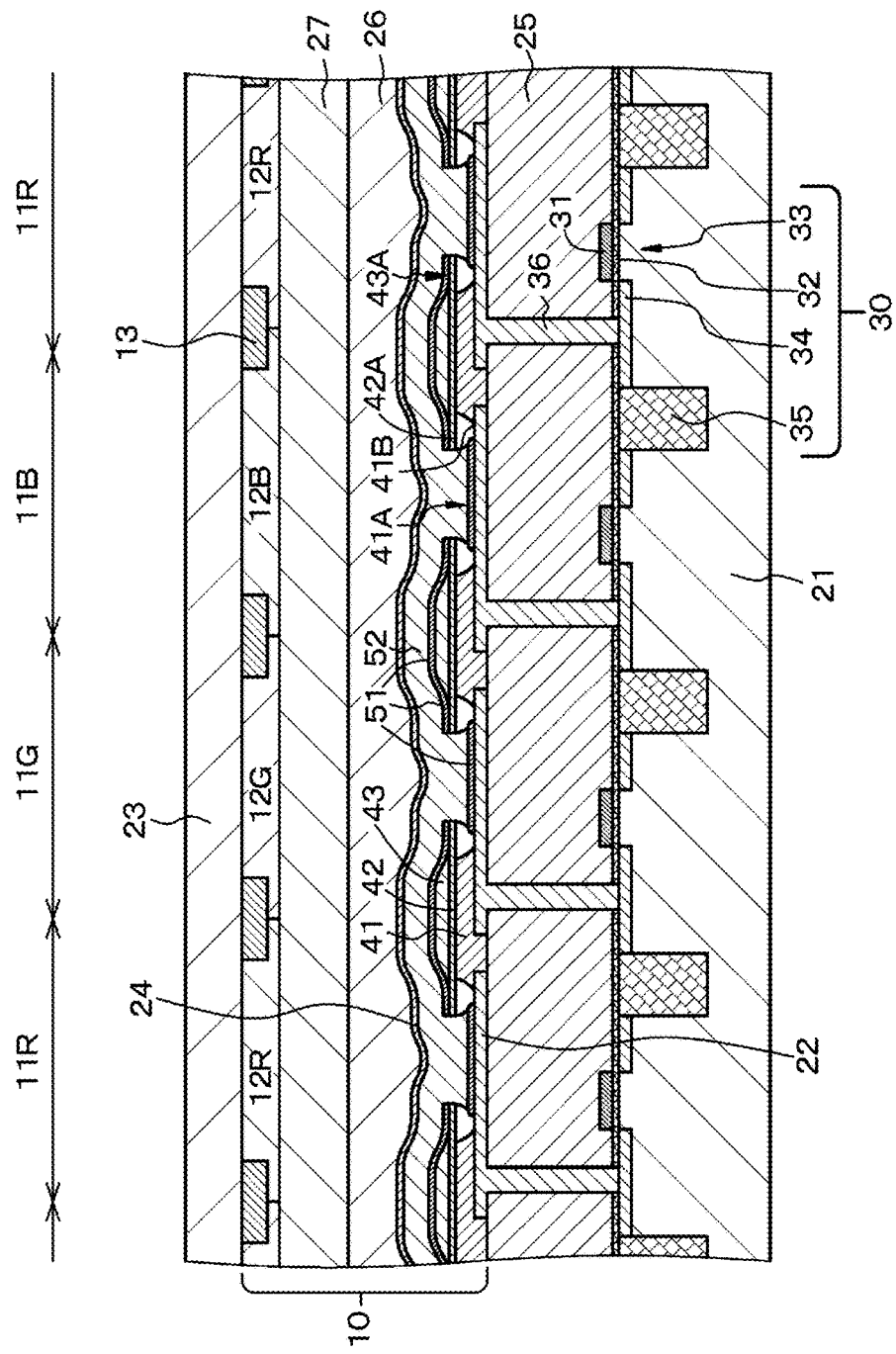
FIG. 1 is a schematic partial cross-sectional view of a display device of a first embodiment.

Hereinafter, the present disclosure will be described on the basis of embodiments with reference to the drawings. However, the present disclosure is not limited to the embodiments, but various numerical values and materials in the embodiments are illustrative. Note that description will be made in the following order.

1. General description on light emitting element of the present disclosure and display device of the present disclosure 2. First embodiment (light emitting element of the present disclosure and display device of the present disclosure)

3. Second embodiment (modification of the first embodiment)

4. Others

<General Description on Light Emitting Element of the Present Disclosure and Display Device of the Present Disclosure>

In a light emitting element or the like of the present disclosure, a top surface of each of a second insulation layer and a third insulation layer in a region beyond the third insulation layer from a protruding end portion of the second insulation layer can be gentle. As a result, an organic layer and a second electrode formed thereon also become gentle, and concentration of an electric field formed by a first electrode and a second electrode in a light emitting layer can be suppressed. When electric field concentration occurs in the light emitting layer, there is a possibility that a light emitting state in the light emitting layer becomes nonuniform. Alternatively, for example, a phenomenon that a region of the light emitting layer corresponding to an edge portion of an aperture emits light in a ring shape (frame shape) occurs. The phrase "a top surface of each of a second insulation layer and a third insulation layer is gentle" means that a curve of a top surface of each of the second insulation layer and the third insulation layer, obtained by cutting the second insulation layer and the third insulation layer along a virtual vertical surface passing through a center of the light emitting element can be differentiated. Note that a part of the curve of the top surface may include a region that cannot be differentiated.

In the light emitting element or the like of the present disclosure including the above preferred form, a material constituting the first insulation layer, a material constituting the second insulation layer, and a material constituting the third insulation layer can be different from one another. Specifically, the insulation layers are preferably constituted by a material in which the second insulation layer and the third insulation layer are hardly etched when the first insulation layer is etched, a material in which the first insulation layer and the third insulation layer are hardly etched when the second insulation layer is etched, and a material in which the first insulation layer and the second insulation layer are hardly etched when the third insulation layer is etched. Examples of a combination of (a material constituting the first insulation layer, a material constituting the second insulation layer, and a material constituting the third insulation layer) include (an SiN-based material, an SiC-based material, and an $SiO_2$-based material), (an SiN-based material, an $SiO_2$-based material, and an SiC-based material), (an SiC-based material, an SiN-based material, and an $SiO_2$-based material), (an SiC-based material, an $SiO_2$-based material, and an SiN-based material), (an $SiO_2$-based material, an SiN-based material, and an SiC-based material), and (an $SiO_2$-based material, an SiC-based material, and an SiN-based material). Herein, the SiN-based material also includes SiON. This also applies to the following. Alternatively, in the light emitting element or the like of the present disclosure including the above preferred forms, a material constituting the first insulation layer can be different from a material constituting the second insulation layer and a material constituting the third insulation layer, and the material constituting the second insulation layer and the material constituting the third insulation layer can be the same as each other. Specifically, the insulation layers are preferably constituted by a material in which the second insulation layer and the third insulation layer are hardly etched when the first insulation layer is etched, and a material in which the first insulation layer is hardly etched when the second insulation layer and the third insulation layer are etched. Examples of a combination of (a material constituting the first insulation layer and a material constituting each of the second insulation layer and the third insulation layer) include (an SiN-based material and an SiC-based material), (an SiC-based material and an SiN-based material), (an SiN-based material and an $SiO_2$-based material), (an $SiO_2$-based material and an SiN-based material), (an SiC-based material and an $SiO_2$-based material), and (an $SiO_2$-based material and an SiC-based material). When a certain insulation layer is etched, in a case where another insulation layer is hardly etched, it is said that there is a large etching selection ratio between the certain insulation layer and the other insulation layer. Here, the etching selection ratio may be two or more although being not limited thereto.

Furthermore, in the light emitting element or the like of the present disclosure including the above-described preferred forms and configurations, the resistance of the charge injection/transport layer can be increased due to discontinuity in at least a part of the charge injection/transport layer at the protruding end portion of the second insulation layer. The entire charge injection/transport layer may be discontinuous at the protruding end portion of the second insulation layer. Alternatively, as long as the state is sufficiently highly resistant, the charge injection/transport layer may be partially connected or may be connected with an extremely thin thickness.

Furthermore, in the light emitting element or the like of the present disclosure including the above-described preferred forms and configurations, the thickness of the second insulation layer above the first electrode can be smaller than the thickness of each of the first insulation layer and the third insulation layer above the first electrode. As a result, at least a part of the charge injection/transport layer can be reliably discontinuous at the protruding end portion of the second insulation layer, and the resistance of the charge injection/transport layer can be increased more reliably. A thickness $T_2$ of the second insulation layer above the first electrode may be 3 nm to 30 nm, for example. A thickness $T_1$ of the first insulation layer above the first electrode may be 5 nm to 50 nm, for example. A thickness $T_3$ of the third insulation layer above the first electrode may be 5 nm to 50 nm, for example. Alternatively, the following can be exemplified.

$0.06 \le T_2/T_1 \le 6$ $0.06 \le T_2/T_3 \le 6$ $0.1 \le T_3/T_1 \le 10$

A length $L_2$ of the protruding end portion of the second insulation layer protruding from the aperture portion may be 10 nm to 150 nm, for example. A relation (aspect ratio) between the length $L_2$ of the protruding end portion of the second insulation layer and the thickness $T_1$ of the first insulation layer may be $0.5 \le L_2/T_1 \le 30$, for example. As a relation between a projection image of an edge portion of an aperture portion in the first insulation layer on the first electrode (referred to as an "aperture portion edge portion projection image") and a projection image of an edge portion of the third insulation layer on the first electrode (referred to as a "third insulation layer edge portion projection image"), the aperture portion edge portion projection image may overlap the third insulation layer edge portion projection image, the aperture portion edge portion projection image may be included in the third insulation layer edge portion projection image, or the third insulation layer edge portion projection image may be included in the aperture portion edge portion projection image. Examples of a planar shape of the aperture portion include a square shape, a square shape with four corners rounded, a rectangular shape, a rectangular shape with four corners rounded, a circular shape, and an elliptical shape.

Furthermore, in the light emitting element or the like of the present disclosure including the above-described preferred forms and configurations, the light emitting layer may be constituted by at least two light emitting layers that emit different colors. In this case, light emitted from the organic layer may be white. Specifically, the light emitting layer may have a structure obtained by laminating three layers of a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm), and emits white light as a whole. Alternatively, the light emitting layer may have a structure obtained by laminating two layers of a blue light emitting layer that emits blue light and a yellow light emitting layer that emits yellow light, and emits white light as a whole. Alternatively, the light emitting layer may have a structure obtained by laminating two layers of a blue light emitting layer that emits blue light and an orange light emitting layer that emits orange light, and emits white light as a whole. In addition, such a white light emitting element that emits white light includes a red color filter to constitute a red light emitting element. The white light emitting element includes a green color filter to constitute a green light emitting element. The white light emitting element includes a blue color filter to constitute a blue light emitting element. One pixel is constituted by a red light emitting element, a green light emitting element, and a blue light emitting element. In some cases, one pixel may be constituted by a red light emitting element, a green light emitting element, a blue light emitting element, and a light emitting element that emits white light (or a light emitting element that emits complementary color light). Note that, in a form constituted by at least two light emitting layers that emit light of different colors, there is actually a case where the light emitting layers that emit light of different colors are mixed and are not clearly separated into the layers. Alternatively, one pixel may be constituted by three sub-pixels (light emitting elements) of a sub-pixel having a red light emitting layer and constituted by a light emitting element that emits red light, a sub-pixel having a green light emitting layer and constituted by a light emitting element that emits green light, and a sub-pixel having a blue light emitting layer and constituted by a light emitting element that emits blue light. Alternatively, one pixel may be constituted by four sub-pixels (light emitting elements) of a sub-pixel having a red light emitting layer and constituted by a light emitting element that emits red light, a sub-pixel having a green light emitting layer and constituted by a light emitting element that emits green light, a sub-pixel having a blue light emitting layer and constituted by a light emitting element that emits blue light, and a sub-pixel including alight emitting element that emits white light (or a light emitting element that emits complementary color light).

The color filter is constituted by a resin to which a coloring agent containing a desired pigment or dye is added. By selecting a pigment or a dye, adjustment is performed such that light transmittance in a target wavelength range of red, green, blue, or the like is high, and light transmittance in the other wavelength ranges is low. For a light emitting element that emits white light, it is only required to dispose a transparent filter. A black matrix layer (light shielding layer) may be formed between a color filter and a color filter. For example, the black matrix layer is constituted by a black resin film (specifically, made of a black polyimide resin, for example) having an optical density of 1 or more, mixed with a black coloring agent, or a thin film filter using interference of a thin film. The thin film filter is formed by laminating two or more thin films made of metal, metal nitride, or metal oxide, for example, and attenuates light by utilizing interference of a thin film. Specific examples of the thin film filter include a thin film filter obtained by alternately laminating Cr and chromium (III) oxide ($Cr_2O_3$).

Furthermore, in the light emitting element or the like of the present disclosure including the above-described preferred forms and configurations, the charge injection/transport layer may exhibit at least one of a charge injection property and a charge transport property. In a case where the first electrode is an anode electrode and the second electrode is a cathode electrode, specifically, the charge injection/transport layer may be constituted by a hole injection layer. In a case where the hole injection layer is not formed but a hole transport layer is formed, the charge injection/transport layer may be constituted by the hole transport layer.

Furthermore, in the light emitting element or the like of the present disclosure including the above-described preferred forms and configurations, the base body may be formed of a silicon semiconductor substrate on which a transistor (specifically, for example, a MOSFET) is formed and an interlayer insulation layer formed thereon, the first electrode and the first insulation layer may be formed on the interlayer insulation layer, and the first electrode may be connected to the transistor formed on the silicon semiconductor substrate via a contact hole formed in the interlayer insulation layer, although being not limited thereto. Note that a display device having such a form is constituted by a top emission type display device described below.

Furthermore, in the display device of the present disclosure including the light emitting element of the present disclosure including the above-described preferred forms and configurations, the first insulation layer, the second insulation layer, the third insulation layer, the charge injection/transport layer, the organic layer, and the second electrode may be common in a plurality of light emitting elements.

The display device of the present disclosure including the above-described various preferred forms may be constituted by an organic electroluminescence display device (organic EL display device). The light emitting element of the present disclosure including the above-described various preferred forms may be constituted by an organic electroluminescence element (organic EL element)

In another expression, the display device of the present disclosure includes a first substrate, a second substrate, and an image display unit sandwiched by the first substrate and the second substrate. In the image display unit, a plurality of the light emitting elements of the present disclosure including the above-described preferred forms and configurations is arranged in a two-dimensional matrix. Herein, the light emitting elements are formed on a side of the first substrate.

The display device of the present disclosure may be a top emission type display device that emits light from the second substrate or a bottom emission type display device that emits light from the first substrate. In the top emission type display device, it is only required to forma color filter and a black matrix layer on a surface side of the second substrate opposed to the first substrate. Meanwhile, in the bottom emission type display device, it is only required to form a color filter and a black matrix layer on a surface side of the first substrate opposed to the second substrate. As described above, in a case where the base body is constituted by a silicon semiconductor substrate on which a transistor is formed and an interlayer insulation layer formed thereon, the silicon semiconductor substrate corresponds to the first substrate. Hereinafter, description will be made exclusively on the basis of an example in which the display device is constituted by a top emission type display device. However, in a case where the display device is constituted by a bottom emission type display device, the following description is only required to be replaced appropriately.

In addition to the silicon semiconductor substrate, the first substrate or the second substrate may be formed of a high strain point glass substrate, a soda glass ($Na_2O.CaO.SiO_2$) substrate, a borosilicate glass ($Na_2O.B_2O_3.SiO_2$) substrate, a forsterite ($2MgO.(SiO_2)$) substrate, a lead glass ($Na_2O.PbO.SiO_2$) substrate, various glass substrates each having an insulating film formed on a surface thereof, a quartz substrate, a quartz substrate having an insulating film formed on a surface thereof, or an organic polymer such as polymethyl methacrylate (PMMA), polyvinyl alcohol (PVA), polyvinyl phenol (PVP), polyether sulfone (PES), polyimide, polycarbonate, or polyethylene terephthalate (PET) (having a form of a polymer material such as a plastic film, a plastic sheet, or a plastic substrate constituted by a polymer material and having flexibility). Materials constituting the first substrate and the second substrate may be the same as or different from each other. However, in the top emission type display device, the second substrate is required to be transparent to light from the light emitting element. In the bottom emission type display device, the first substrate is required to be transparent to light from the light emitting element.

In a case where the first electrode is caused to function as an anode electrode, examples of a material constituting the first electrode include aluminum (Al) and an alloy containing aluminum, and a metal such as platinum (Pt), gold (Au), silver (Ag), chromium (Cr), molybdenum (Mo), titanium (Ti), tungsten (W), nickel (Ni), copper (Cu), iron (Fe), cobalt (Co), or tantalum (Ta) or an alloy thereof (for example, an Ag—Pd—Cu alloy containing silver as a main component and containing 0.3% by mass to 1% by mass of palladium (Pd) and 0.3% by mass to 1% by mass of copper (Cu), an Al—Nd alloy, or Al—Ni alloy). The thickness of the first electrode may be 0.1 µm to 1 µm, for example. Alternatively, the material constituting the first electrode may be a transparent conductive material having excellent hole injection characteristics, such as an oxide of indium and tin (ITO) or an oxide of indium and zinc (IZO), or may have a structure obtained by laminating a transparent conductive material having excellent hole injection characteristics, such as an oxide of indium and tin (ITO) or an oxide of indium and zinc (IZO) on a dielectric multilayer film or a reflective film having high light reflectivity, formed of aluminum (Al) or the like. Meanwhile, in a case where the first electrode is caused to function as a cathode electrode, the first electrode is desirably constituted by a conductive material having a small work function value and high light reflectivity. However, by improving an electron injection property, for example, by disposing an appropriate electron injection layer in a conductive material having high light reflectivity used as an anode electrode, the resulting conductive material can also be used as a cathode electrode.

Meanwhile, in a case where the second electrode is caused to function as a cathode electrode, a material constituting the second electrode (a semi-light transmitting material or a light transmitting material) is desirably constituted by a conductive material having a small work function value so as to be able to transmit emitted light and inject an electron into an organic layer efficiently. Examples of the material constituting the second electrode include a metal having a small work function and an alloy thereof, such as aluminum (Al), silver (Ag), magnesium (Mg), calcium (Ca), sodium (Na), strontium (Sr), an alkali metal or an alkaline earth metal and silver (Ag) [for example, an alloy of magnesium (Mg) and silver (Ag) (Mg—Ag alloy)], an alloy of magnesium-calcium (Mg—Ca alloy), or an alloy of aluminum (Al) and lithium (Li) (Al—Li alloy). Among these materials, an Mg—Ag alloy is preferable, and a volume ratio between magnesium and silver may be Mg:Ag=5:1 to 30:1, for example. Alternatively, as a volume ratio between magnesium and calcium may be Mg:Ca=2:1 to 10:1, for example. The thickness of the second electrode may be 4 nm to 50 nm, preferably 4 nm to 20 nm, and more preferably 6 nm to 12 nm, for example. Alternatively, the second electrode may have a lamination structure of the above material layer and a so-called transparent electrode (for example, thickness $3 \times 10^{-8}$ m to $1 \times 10^{-6}$ m) formed of, for example, ITO or IZO. A bus electrode (auxiliary electrode) formed of a low resistance material such as aluminum, an aluminum alloy, silver, a silver alloy, copper, a copper alloy, gold, or a gold alloy may be disposed in the second electrode to reduce resistance as the whole second electrode. Meanwhile, in a case where the second electrode is caused to function as an anode electrode, the second electrode is desirably constituted by a conductive material that transmits emitted light and has a large work function value. Average light transmittance of the second electrode is 50% to 90%, and preferably 60% to 90%.

Examples of a method for forming the first electrode or the second electrode include a combination of a vapor deposition method including an electron beam vapor deposition method, a hot filament vapor deposition method, and a vacuum vapor deposition method, a sputtering method, a chemical vapor deposition method (CVD method), an MOCVD method, and an ion plating method with an etching method; various printing methods such as a screen printing method, an inkjet printing method, and a metal mask printing method; a plating method (an electroplating method or an electroless plating method); a lift-off method; a laser ablation method; and a sol-gel method. According to various printing methods and a plating method, the first electrode or the second electrode having a desired shape (pattern) can be formed directly. Note that, in a case where the second electrode is formed after the organic layer is formed, the second electrode is preferably formed particularly on the basis of a film formation method in which energy of film formation particles is small, such as a vacuum vapor deposition method, or a film formation method such as an MOCVD method from a viewpoint of preventing the organic layer from being damaged. When the organic layer is damaged, non-light emitting pixels (or non-light emitting sub-pixels) called "dark spots" due to generation of a leak current may be generated. In addition, processes from formation of the organic layer to formation of these electrodes are preferably performed without exposure thereof to the atmosphere from a viewpoint of preventing deterioration of the organic layer due to moisture in the atmosphere. As described above, in some cases, the second electrode does not need to be patterned, and may be a so-called common electrode.

The organic layer includes a light emitting layer. In addition to the light emitting layer, for example, the organic layer may be constituted by a lamination structure of a hole transport layer, a light emitting layer, and an electron transport layer or a laminated structure of a hole transport layer and a light emitting layer serving also as an electron transport layer. Examples of a method for forming the organic layer include a physical vapor deposition method (PVD method) such as a vacuum vapor deposition method; a printing method such as a screen printing method or an inkjet printing method; a laser transfer method in which an organic layer on a laser absorption layer is separated by irradiating a lamination structure of a laser absorption layer and an organic layer formed on a transfer substrate with a laser and the organic layer is transferred, and various coating methods. In a case where the organic layer is formed on the basis of the vacuum vapor deposition method, for example, using a so-called metal mask, the organic layer can be obtained by depositing a material that has passed through an aperture disposed in the metal mask, or the organic layer may be formed on the entire surface without patterning as described above. In some cases, at least a part of a part of the organic layer (specifically, for example, a hole transport layer) may be discontinuous at a protruding end portion of the second insulation layer. Examples of a method for forming the charge injection/transport layer include a PVD method such as a vacuum vapor deposition method.

The thickness of a hole transport layer (hole supply layer) and the thickness of an electron transport layer (electron supply layer) are preferably substantially equal to each other. Alternatively, the thickness of the electron transport layer (electron supply layer) may be larger than that of the hole transport layer (hole supply layer). As a result, an electron can be supplied sufficiently to the light emitting layer in an amount necessary for a high efficiency at a low driving voltage. That is, by disposing a hole transport layer between the first electrode corresponding to an anode electrode and the light emitting layer, and forming the hole transport layer with a film having a film thickness smaller than the electron transport layer, supply of holes can be increased. Then, this makes it possible to obtain a carrier balance with no excess or deficiency of holes and electrons and a sufficiently large carrier supply amount. Therefore, a high emission efficiency can be obtained. In addition, due to no excess or deficiency of holes and electrons, the carrier balance hardly collapses, drive deterioration is suppressed, and an emission lifetime can be prolonged.

The first electrode is disposed on the interlayer insulation layer, as described above. In addition, the interlayer insulation layer covers a light emitting element driving unit formed on the first substrate. The light emitting element driving unit is constituted by one or more transistors (for example, MOSFET or TFT). The transistors are electrically connected to the first electrode via a contact hole (contact plug) disposed in the interlayer insulation layer, as described above. The light emitting element driving unit can have a known circuit configuration. As a constituent material of the interlayer insulation layer, an $SiO_2$-based material such as $SiO_2$, BPSG, PSG, BSG, AsSG, PbSG, SOG (spin on glass), low melting point glass, or glass paste; an SiN-based material including an SiON-based material; or an insulating resin such as an acrylic resin or a polyimide resin can be used singly or in combination thereof appropriately. For forming the interlayer insulation layer, a known process such as a CVD method, a coating method, a sputtering method, or various printing methods can be used.

An insulating or conductive protective film is preferably disposed above the second electrode in order to prevent moisture from reaching the organic layer. The protective film is preferably formed particularly on the basis of a film formation method in which the energy of film formation particles is small, such as a vacuum vapor deposition method, or a film formation method such as a CVD method or an MOCVD method because an influence on a base can be reduced. Alternatively, in order to prevent degradation of brightness due to deterioration of the organic layer, a film formation temperature is desirably set to room temperature. Furthermore, in order to prevent peeling of the protective film, the protective film is desirably formed under a condition minimizing a stress of the protective film. In addition, the protective film is preferably formed without exposure of an already formed electrode to the atmosphere. As a result, degradation of the organic layer due to moisture or oxygen in the atmosphere can be prevented. Furthermore, the protective film is desirably constituted by a material that transmits light generated in the organic layer by, for example, 80% or more. Specific examples of the material include an inorganic amorphous insulating material such as the following materials. Such an inorganic amorphous insulating material does not generate grains, and therefore has low water permeability and constitutes a good protective film. Specifically, as a material constituting the protective film, a material that is transparent to light emitted from the light emitting layer, is dense, and does not transmit moisture is preferably used. More specific examples of the material include amorphous silicon ($\alpha$-Si), amorphous silicon carbide ($\alpha$-SiC), amorphous silicon nitride ($\alpha$-$Si_{1-x}N_x$), amorphous silicon oxide ($\alpha$-$Si_{1-y}O_y$), amorphous carbon ($\alpha$-C), amorphous silicon oxide/nitride ($\alpha$-SiON), and $Al_2O_3$. In a case where the protective film is constituted by a conductive material, the protective film is only required to be constituted by a transparent conductive material such as ITO or IZO. The protective film and the second substrate are bonded to each other, for example, via a resin layer (sealing resin layer). Examples of a material constituting the resin layer (sealing resin layer) include a thermosetting adhesive such as an acrylic adhesive, an epoxy adhesive, a urethane adhesive, a silicone adhesive, or a cyanoacrylate adhesive, and an ultraviolet curable adhesive.

On an outermost surface of the display device, an ultraviolet absorbing layer, a contamination preventing layer, a hard coat layer, and an antistatic layer may be formed, or a protective member may be disposed.

The display device may have a resonator structure in order to further improve a light extraction efficiency. Specifically, light emitted from the light emitting layer is caused to resonate between a first interface constituted by an interface between the first electrode and the organic layer (or an interface between a light reflecting layer disposed below the first electrode via an interlayer insulation layer and the interlayer insulation layer) and a second interface constituted by an interface between the second electrode and the organic layer, and a part of the light is emitted from the second electrode. Then, when a distance from a maximum emission position of the light emitting layer to the first interface is represented by $L_1$, an optical distance thereof is represented by $OL_1$, a distance from the maximum emission position of the light emitting layer to the second interface is represented by $L_2$, an optical distance thereof is represented by $OL_2$, and $m_1$ and $m_2$ each represent an integer, the following formulas (1-1), (1-2), (1-3), and (1-4) are satisfied.

$$0.7\{-\Phi_1/(2\pi)+m_1\} \leq 2\times OL_1/\lambda \leq 1.2\{-\Phi_1/(2\pi)+m_1\} \quad (1\text{-}1)$$

$$0.7\{-\Phi_2/(2\pi)+m_2\} \leq 2\times OL_2/\lambda \leq 1.2\{-\Phi_2/(2\pi)+m_2\} \quad (1\text{-}2)$$

$$L_1 < L_2 \quad (1\text{-}3)$$

$$m_1 < m_2 \quad (1\text{-}4)$$

Herein, $\lambda$: Maximum peak wavelength of a spectrum of light generated in the light emitting layer (or a desired wavelength among wavelengths of light generated in the light emitting layer)

$\Phi_1$: Phase shift amount (unit: radian) of light reflected on the first interface Provided that $-2\pi < \Phi_1 \leq 0$.

$\Phi_2$: Phase shift amount (unit: radian) of light reflected on the second interface Provided that $-2\pi < \Phi_2 \leq 0$.

Incidentally, the distance $L_1$ from the maximum emission position of the light emitting layer to the first interface means an actual distance (physical distance) from the maximum emission position of the light emitting layer to the first interface and the distance $L_2$ from the maximum emission position of the light emitting layer to the second interface means an actual distance (physical distance) from the maximum emission position of the light emitting layer to the second interface. In addition, the optical distance is also called an optical path length, and generally refers to n×L when a light ray passes through a medium having a refractive index n for a distance L. The same applies to the following description. Therefore, when an average refractive index is represented by $n_0$, the following relations are satisfied.

$$OL_1 = L_1 \times n_0$$

$$OL_2 = L_2 \times n_0$$

Herein, the average refractive index $n_0$ is obtained by summing up a product of the refractive index and the thickness of each layer constituting the organic layer and various interlayer insulation layers, and dividing the resulting sum by the thickness of the organic layer and the various interlayer insulation layers. In addition, the second electrode may be formed of a semi-light transmitting material and may have a form of $m_1=0$ and $m_2=1$ in which a light extraction efficiency can be maximized.

The light reflecting layer and the second electrode absorb a part of incident light and reflect the rest. Therefore, a phase shift occurs in the reflected light. The phase shift amounts $\Phi_1$ and $\Phi_2$ can be determined by measuring values of a real number part and an imaginary number part of a complex refractive index of each of materials constituting the light reflecting layer and the second electrode, for example, using an ellipsometer, and performing calculation based on these values (See, for example, "Principles of Optic", Max Born and Emil Wolf, 1974 (PERGAMON PRESS)). Note that the refractive index of the organic layer, various interlayer insulation layers, or the like can also be determined by measurement with an ellipsometer.

As described above, in an organic EL display device having a resonator structure, actually, a red light emitting element constituted by inclusion of a red color filter in a white light emitting element causes red light emitted from the light emitting layer to resonate, and emits reddish light (light having a light spectrum peak in a red region) from the second electrode. In addition, the green light emitting element constituted by inclusion of a green color filter in a white light emitting element causes green light emitted from the light emitting layer to resonate, and emits greenish light (light having a light spectrum peak in a green region) from the second electrode. In addition, the blue light emitting element constituted by inclusion of a blue color filter in a white light emitting element causes blue light emitted from the light emitting layer to resonate, and emits blueish light (light having a light spectrum peak in a blue region) from the second electrode. That is, it is only required to design each light emitting element by determining a desired wavelength A (specifically, wavelengths of red light, green light, and blue light) among wavelengths of light generated in the light emitting layer and determining various parameters such as $OL_1$ and $OL_2$ in each of the red light emitting element, the green light emitting element, and the blue light emitting element on the basis of formulas (1-2), (1-2), (1-3), and (1-4).

Examples of a material constituting the light reflecting layer include aluminum, an aluminum alloy (for example, Al—Nd), a Ti/Al lamination structure, chromium (Cr), silver (Ag), and a silver alloy (for example, Ag—Pd—Cu or Ag—Sm—Cu). The light reflecting layer can be formed, for example, by a vapor deposition method including an electron beam vapor deposition method, a hot filament vapor deposition method, and a vacuum vapor deposition method, a sputtering method, a CVD method, and an ion plating method; a plating method (an electroplating method or an electroless plating method); a lift-off method; a laser ablation method; a sol-gel method, or the like.

The display device can be used, for example, as a monitor device constituting a personal computer, or a monitor device incorporated in a television receiver, a mobile phone, a personal digital assistant (PDA), or a game machine. Alternatively, the display device can be applied to an electronic view finder (EVF) or a head mounted display (HMD).

First Embodiment

Figure 2:
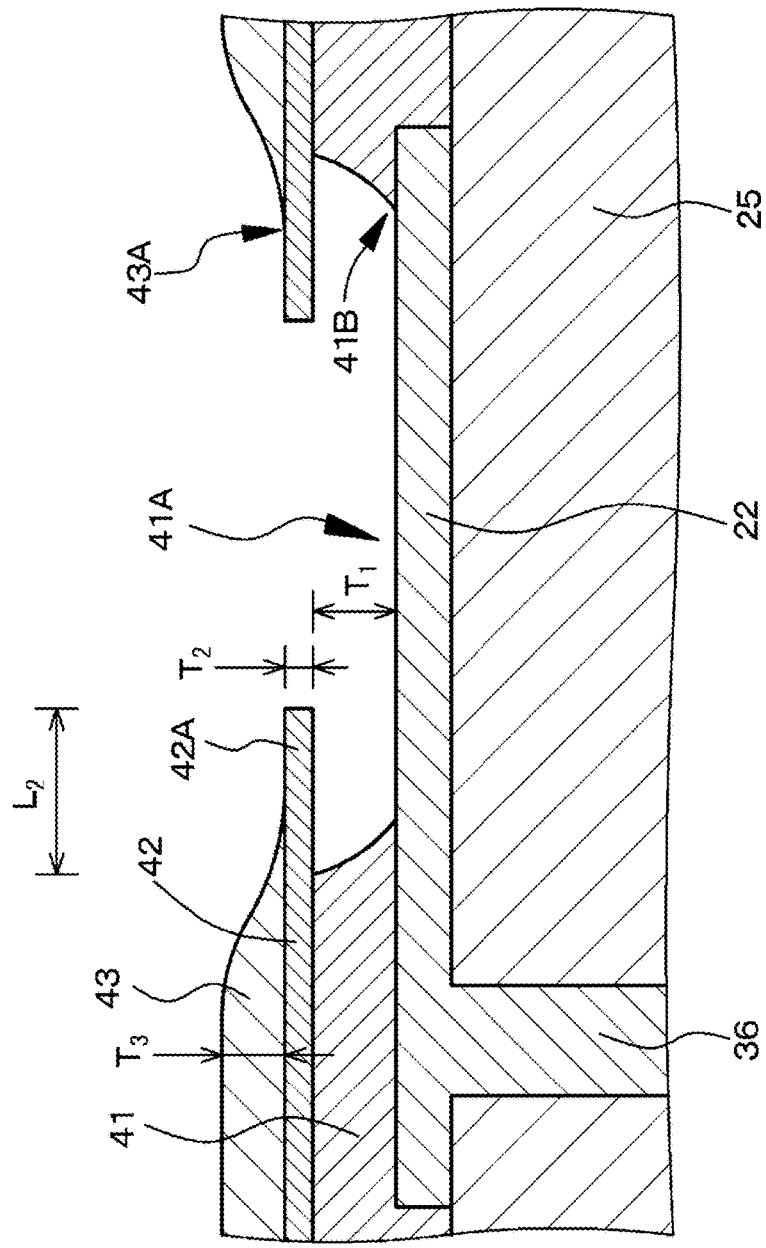
FIG. 2 is an enlarged schematic partial cross-sectional view of a first insulation layer, a second insulation layer, a third insulation layer, and the like in a light emitting element constituting the display device of the first embodiment.
Figure 3:
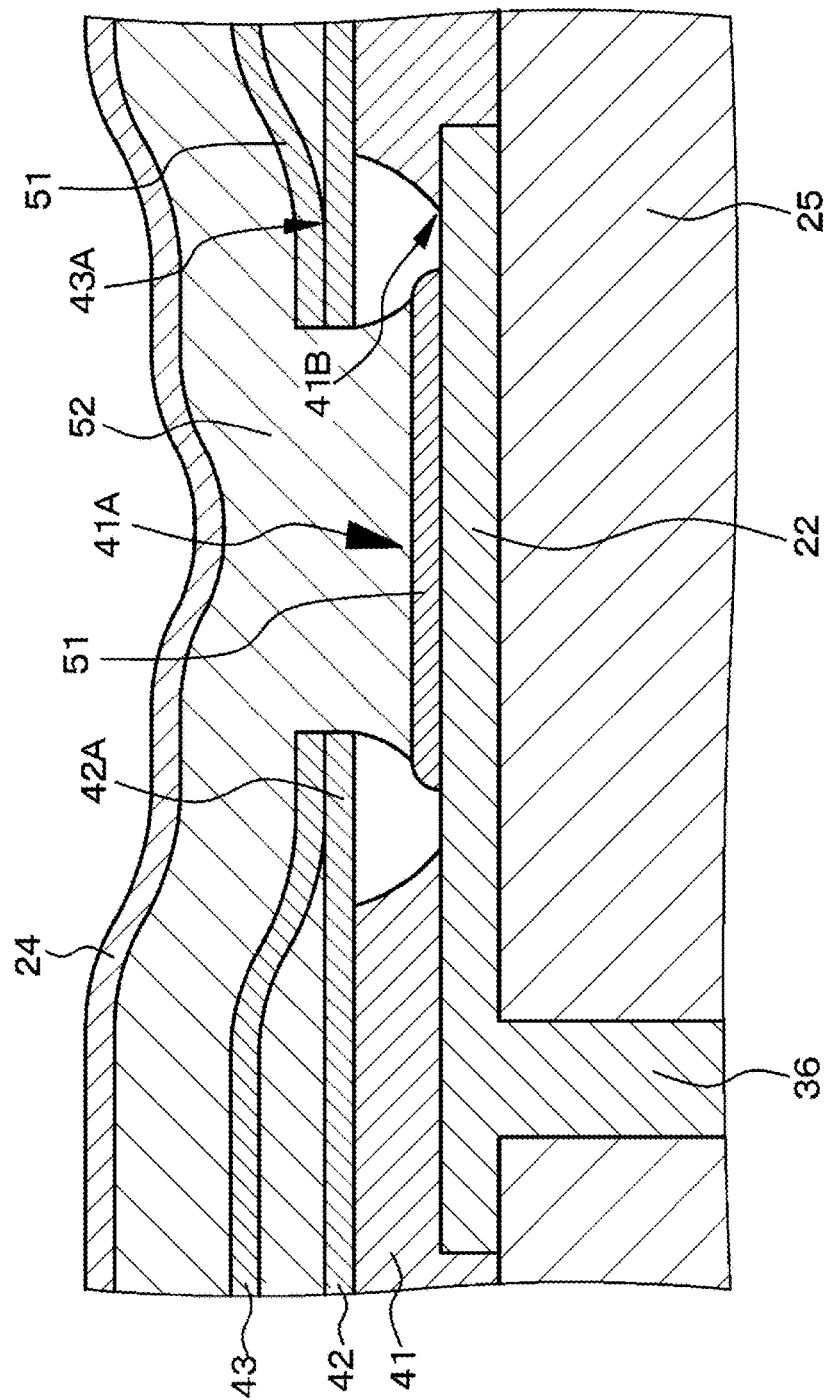
FIG. 3 is an enlarged schematic partial cross-sectional view of an organic layer and the like in the light emitting element constituting the display device of the first embodiment.

A first embodiment relates to a light emitting element (specifically, organic EL element) of the present disclosure and a display device (specifically, an organic EL display device) of the present disclosure. FIG. 1 illustrates a schematic partial cross-sectional view of a display device of the first embodiment (hereinafter, also referred to as an organic EL display device). FIG. 2 illustrates an enlarged schematic partial cross-sectional view of a first insulation layer, a second insulation layer, a third insulation layer, and the like in a light emitting element constituting the display device of the first embodiment. FIG. 3 illustrates an enlarged schematic partial cross-sectional view of an organic layer and the like. The organic EL display device of the first embodiment is an active matrix type color display organic EL display device, and is a top emission type display device. That is, light is emitted through an second electrode.

In the organic EL display device of the first embodiment, a plurality of light emitting elements 11 of the first embodiment described below is arranged in a two-dimensional matrix. Alternatively, in another expression, the organic EL display device of the first embodiment includes a first substrate 21, a second substrate 23, and an image display unit 10 sandwiched by the first substrate 21 and the second substrate 23. In the image display unit 10, the plurality of light emitting elements 11 of the first embodiment described below is arranged in a two-dimensional matrix. The light emitting elements 11 are formed on a side of the first substrate.

Each of the light emitting elements 11 of the first embodiment includes:

a first electrode 22 formed on a base body;

a first insulation layer 41 formed on the base body and the first electrode 22 and having an aperture portion 41A in which a part of the first electrode 22 is exposed;

a second insulation layer 42 formed on the first insulation layer 41 and having a protruding end portion 42A protruding from the aperture portion 41A disposed in the first insulation layer 41;

a third insulation layer 43 formed on the second insulation layer 42 and having an end portion 43A recessed from the protruding end portion 42A of the second insulation layer 42;

a charge injection/transport layer 51 formed over the second insulation layer 42 and the third insulation layer 43 from the first electrode 22;

an organic layer 52 formed on the charge injection/transport layer 51 and including a light emitting layer formed of an organic light emitting material; and a second electrode 24 formed on the organic layer 52, and at least a part of the charge injection/transport layer 51 is discontinuous at the protruding end portion 42A of the second insulation layer 42.

In the first embodiment, a material constituting the first insulation layer 41, a material constituting the second insulation layer 42, and a material constituting the third insulation layer 43 are different from one another. Specifically, the insulation layers 41, 42, and 43 are constituted by a material in which the second insulation layer 42 and the third insulation layer 43 are hardly etched when the first insulation layer 41 is etched, a material in which the first insulation layer 41 and the third insulation layer 43 are hardly etched when the second insulation layer 42 is etched, and a material in which the first insulation layer 41 and the second insulation layer 42 are hardly etched when the third insulation layer 43 is etched. A specific combination of (material constituting the first insulation layer 41, material constituting the second insulation layer 42, and material constituting the third insulation layer 43) is (SiN-based material, SiC-based material, and $SiO_2$-based material). In addition, a thickness $T_2$ of the second insulation layer 42 above the first electrode 22 is smaller than each of thicknesses $T_1$ and $T_3$ of the first insulation layer 41 and the third insulation layer 43 above the first electrode 22. Specifically, the first insulation layer 41 having the thickness $T_1$ of 30 nm above the first electrode 22 is formed of SiN, the second insulation layer 42 having the thickness $T_2$ of 20 nm above the first electrode 22 is formed of SiC, and the third insulation layer 43 having the thickness $T_3$ of 50 nm above the first electrode 22 is formed of $SiO_2$. A length $L_2$ of the protruding end portion 42A of the second insulation layer 42 protruding from the aperture portion 41A is, for example, 100 nm. In addition, a relation (aspect ratio) between the length $L_2$ of the protruding end portion 42A of the second insulation layer 42 and the thickness $T_1$ of the first insulation layer 41 is $L_2/T_1=3.3$. An aperture portion edge portion projection image is included in a third insulation layer edge portion projection image. In other words, the end portion 43A of the third insulation layer 43 protrudes more than an edge portion 41B of the aperture portion 41A. A distance (protrusion amount) from the aperture portion edge portion projection image to the third insulation layer edge portion projection image is, for example, 50 nm. The planar shape of the aperture portion 41A is, for example, a rectangular shape in which the four corners of 2 μm×2 μm are rounded, or a circular shape with a diameter of 2 μm. The charge injection/transport layer 51 or a part of the organic layer 52 may be formed in a region surrounded by the protruding end portion 42A of the second insulation layer 42, the edge portion 41B of the aperture portion 41 disposed in the first insulation layer 41, and the first electrode 22. However, in the example illustrated in FIG. 1, the region is a vacant space.

In addition, top surfaces of the second insulation layer 42 and the third insulation layer 43 in the region beyond the third insulation layer 43 from the protruding end portion 42A of the second insulation layer 42 are gentle.

Figure 12A:
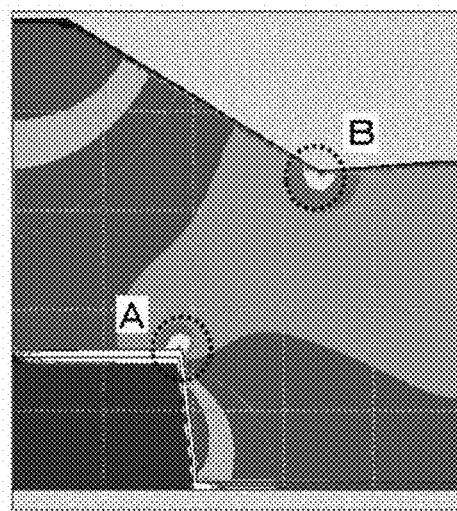
FIGS. 12A and 12B are diagrams illustrating simulation results of an electric field concentration state in a case where a top surface of the part of an organic layer positioned above a region beyond the third insulation layer from the protruding end portion of the second insulation layer is not gentle and in a case where the top surface is gentle, respectively.
Figure 12B:
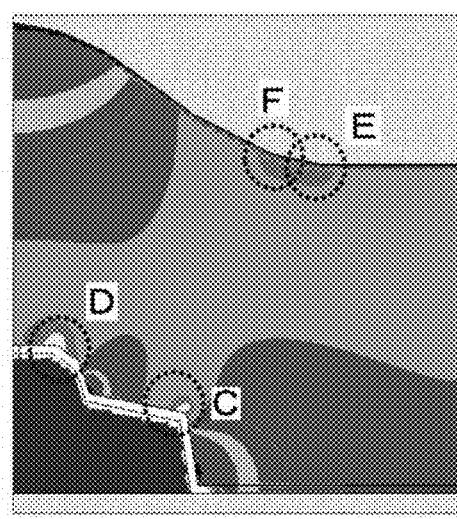

FIGS. 12A and 12B illustrate simulation results of an electric field concentration state in a case where a top surface of the part of an organic layer positioned above a region beyond the third insulation layer from the protruding end portion of the second insulation layer is not gentle and in a case where the top surface is gentle, respectively. The sizes in FIGS. 12A and 12B correspond to 250 nm in length and 250 nm in width. In FIG. 12A, when the electric field intensity at an end portion of the aperture portion as a region surrounded by "A" was "1", the electric field intensity of a region of the organic layer surrounded by "B" with a not gentle top surface was 0.92. Meanwhile, in FIG. 12B, the electric field intensity at an end portion of the aperture portion as a region surrounded by "C" was 0.78, and the electric field intensity in a region surrounded by "D" as a region above the third insulation layer was 0.81. The electric field intensities of organic layer regions surrounded by "E" and "F" with gentle top surfaces were 0.64 and 0.66, respectively. Note that the edge portion of the aperture portion disposed in the first insulation layer is omitted in the simulation of the example illustrated in FIG. 12B. As described above, it is found that, by making the top surfaces of the second insulation layer 42 and the third insulation layer 43 in the region beyond the third insulation layer 43 from the protruding end portion 42A of the second insulation layer 42 gentle, the organic layer 52 and the second electrode 24 formed thereon become gentle and concentration of an electric field formed by the first electrode 22 and the second electrode 24 in the light emitting layer can be suppressed.

Herein, the resistance of the charge injection/transport layer 51 is increased due to discontinuity in at least a part of the charge injection/transport layer 51 at the protruding end portion 42A of the second insulation layer 42. The entire charge injection/transport layer 51 may be discontinuous at the protruding end portion 42A of the second insulation layer 42.

In the first embodiment, the organic layer 52 has a lamination structure of a hole transport layer (HTL), a light emitting layer, an electron transport layer (ETL), and an electron injection layer (EIL) from a side of the charge injection/transport layer. The light emitting layer is constituted by at least two light emitting layers that emit different colors, and light emitted from the organic layer 52 is white. Specifically, the light emitting layer has a structure in which three layers of a red light emitting layer that emits red light, a green light emitting layer that emits green light, and a blue light emitting layer that emits blue light are laminated. The light emitting layer may have a structure in which two layers of a blue light emitting layer that emits blue light and a yellow light emitting layer that emits yellow light are laminated or a structure in which two layers of a blue light emitting layer that emits blue light and an orange light emitting layer that emits orange light are laminated. A light emitting element to display a red color (red light emitting element 11R) includes a red color filter 12R. A light emitting element to display a green color (green light emitting element 11G) includes a green color filter 12G. A light emitting element to display a blue color (blue light emitting element 11B) includes a blued color filter 12B. The red light emitting element 11R, the green light emitting element 11G, and the blue light emitting element 11B have the same configuration and structure except for the color filters. A black matrix layer (light shielding layer) 13 is formed between a color filter 12 and a color filter 12. In addition, the color filter 12 and the black matrix layer 13 are formed on a surface side of the second substrate 23 opposed to the first substrate 21. This makes it possible to shorten a distance between the light emitting layer and the color filter 12 and to suppress color mixing caused by incidence of light emitted from the light emitting layer on an adjacent color filter 12 of another color.

In the first embodiment, the charge injection/transport layer 51 exhibits at least one of a charge injection property and a charge transport property. Specifically, the charge injection/transport layer 51 is constituted by a hole injection layer (HIL).

The charge injection/transport layer 51 functioning as a hole injection layer is a layer that increases a hole injection efficiency, functions as a buffer layer for preventing leakage, and has a thickness of about 2 nm to 10 nm, for example. The hole injection layer is formed of a hexaazatriphenylene derivative represented by the following formula (A) or (B), for example.

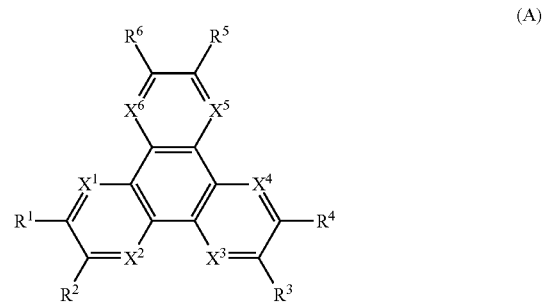

(A)

Herein, $R^1$ to $R^6$ each independently represent a substituent selected from a hydrogen atom, a halogen atom, a hydroxy group, an amino group, an arulamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, and a silyl group, and adjacent $R^m$'s (m=1 to 6) may be bonded to each other via a cyclic structure. In addition, $X^1$ to $X^6$ each independently represent a carbon atom or a nitrogen atom.

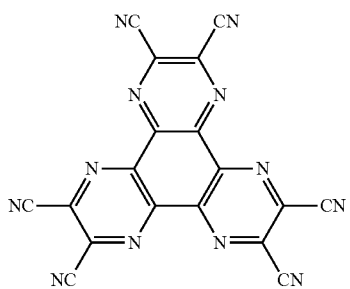

(B)

The hole transport layer is a layer that increases a hole transport efficiency to the light emitting layer. When an electric field is applied to the light emitting layer, recombination of electrons and holes occurs to generate light. The electron transport layer is a layer that increases an electron transport efficiency to the light emitting layer, and the electron injection layer is a layer that increases an electron injection efficiency to the light emitting layer.

The hole transport layer is formed of 4,4',4''-tris(3-methylphenylphenylamino) triphenylamine <m-MTDATA> or α-naphthylphenyl diamine <αNPD> having a thickness of about 40 nm, for example.

The light emitting layer is a light emitting layer that generates white light by color mixing, and is formed by laminating a red light emitting layer, a green light emitting layer, and a blue light emitting layer as described above, for example.

When an electric field is applied to the red light emitting layer, a part of holes injected from the first electrode 22 and a part of electrons injected from the second electrode 24 are recombined to generate red light. Such a red light emitting layer contains at least one kind of material among a red light emitting material, a hole transport material, an electron transport material, and a both charge transport material, for example. The red light emitting material may be a fluorescent material or a phosphorescent material. The red light emitting layer having a thickness of about 5 nm is formed by mixing 30% by mass of 2,6-bis[(4'-methoxydiphenylamino) styryl]-1,5-dicyanonaphthalene <BSN> with 4,4-bis(2,2-diphenylvinin) biphenyl <DPVBi>, for example.

When an electric field is applied to the green light emitting layer, a part of holes injected from the first electrode 22 and a part of electrons injected from the second electrode 24 are recombined to generate green light. Such a green light emitting layer contains at least one kind of material among a green light emitting material, a hole transport material, an electron transport material, and a both charge transport material, for example. The green light emitting material may be a fluorescent material or a phosphorescent material. The green light emitting layer having a thickness of about 10 nm is formed by mixing 5% by mass of coumarin 6 with DPVBi, for example.

When an electric field is applied to the blue light emitting layer, a part of holes injected from the first electrode 22 and a part of electrons injected from the second electrode 24 are recombined to generate blue light. Such a blue light emitting layer contains at least one kind of material among a blue light emitting material, a hole transport material, an electron transport material, and a both charge transport material, for example. The blue light emitting material may be a fluorescent material or a phosphorescent material. The blue light emitting layer having a thickness of about 30 nm is formed by mixing 2.5% by mass of 4,4'-bis [2-{4-(N,N-diphenylamino) phenyl} vinyl] biphenyl <DPAVBi> with DPVBi.

The electron transport layer having a thickness of about 20 nm is formed of 8-hydroxyquinoline aluminum <Alq 3>, for example. The electron injection layer having a thickness of about 0.3 nm is formed of LiF or $Li_2O$, for example.

Each of the light emitting elements 11 may have a resonator structure in which the organic layer 52 is a resonance part. In this case, in order to appropriately adjust a distance from a light emitting surface to a reflecting surface (specifically, the first electrode 22 and the second electrode 24), the thickness of the organic layer 52 is preferably $8 \times 10^{-8}$ m or more and $5 \times 10^{-7}$ m or less, and more preferably $1.5 \times 10^{-7}$ m or more and $3.5 \times 10^{-7}$ m or less.

In addition, the first insulation layer 41, the second insulation layer 42, the third insulation layer 43, the charge injection/transport layer 51, the organic layer 52, and the second electrode 24 are common in the plurality of light emitting elements. That is, these layers 41, 42, 43, 51, and 52 and the second electrode 24 are not patterned and are in a so-called solid film state. As described above, by forming a solid film of a light emitting layer common in all the light emitting elements without forming the light emitting layer separately for each light emitting element (patterning formation), the light emitting elements can also correspond to a small and high-resolution display device having a field angle of several inches or less and a pixel pitch of several tens of micrometers or less, for example.

An insulating or conductive protection film 26 (specifically, formed of an $SiO_2$-based material or an SiN-based material, for example) is disposed above the second electrode 24 in order to prevent moisture from reaching the organic layer 52. Furthermore, the protective film 26 and the second substrate 23 are bonded to each other via a resin layer (sealing resin layer) 27 formed of an epoxy adhesive, for example. The first electrode 22 functioning as an anode electrode is formed of aluminum (Al—Ni alloy) having a thickness of 0.1 μm. The second electrode 24 functioning as a cathode electrode is formed of an Mg—Ag alloy having a thickness of 10 nm.

In the first embodiment, the base body is constituted by a silicon semiconductor substrate (first substrate 21) on which a transistor (specifically, MOSFET, for example) 30 is formed and an interlayer insulation layer 25 formed of $SiO_2$ formed thereon. The first electrode 22 and the first insulation layer 41 are formed on the interlayer insulation layer 25. The first electrode 22 and the transistor 30 formed on the silicon semiconductor substrate (first substrate 21) are connected to each other via a contact hole 36 formed in the interlayer insulation layer 25. Herein, the transistor 30 formed of a MOSFET is constituted by a gate electrode 31, a gate insulation layer 32, a channel formation region 33, and a source/drain region 34. An element isolation region 35 is formed between the transistors 30, and the transistors 30 are thereby separated from each other.

Hereinafter, the outline of a method for manufacturing the organic EL display device of the first embodiment will be described.

[Step-100]

Figure 4:
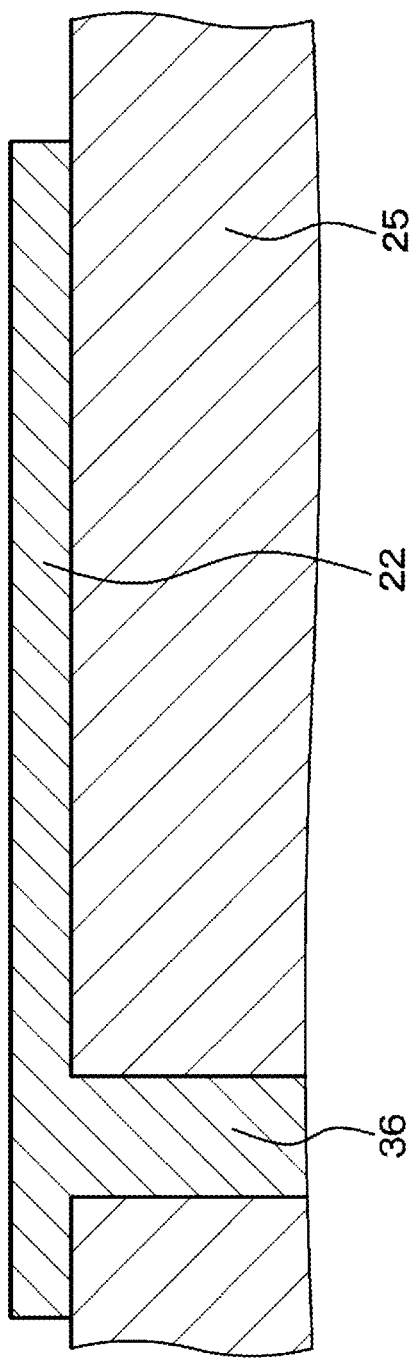
FIG. 4 is a schematic partial cross-sectional view illustrating an interlayer insulation layer and the like for describing a method for manufacturing the display device of the first embodiment.

First, a light emitting element driving unit is formed on a silicon semiconductor substrate (first substrate 21) on the basis of a known MOSFET manufacturing process, and then the interlayer insulation layer 25 is formed on the entire surface on the basis of a CVD method. Then, in the portion of the interlayer insulation layer 25 positioned above one of source/drain regions of the transistor 30, a connection hole is formed on the basis of a photolithography technique and an etching technique. Thereafter, a metal layer is formed on the interlayer insulation layer 25 including the connection hole on the basis of a sputtering method, for example. Subsequently, the metal layer is patterned on the basis of a photolithography technique and an etching technique, and the first electrode 22 can be thereby formed on the interlayer insulation layer 25 (see FIG. 4). The first electrode 22 is separated for each light emitting element.

[Step-110]

Figure 5:
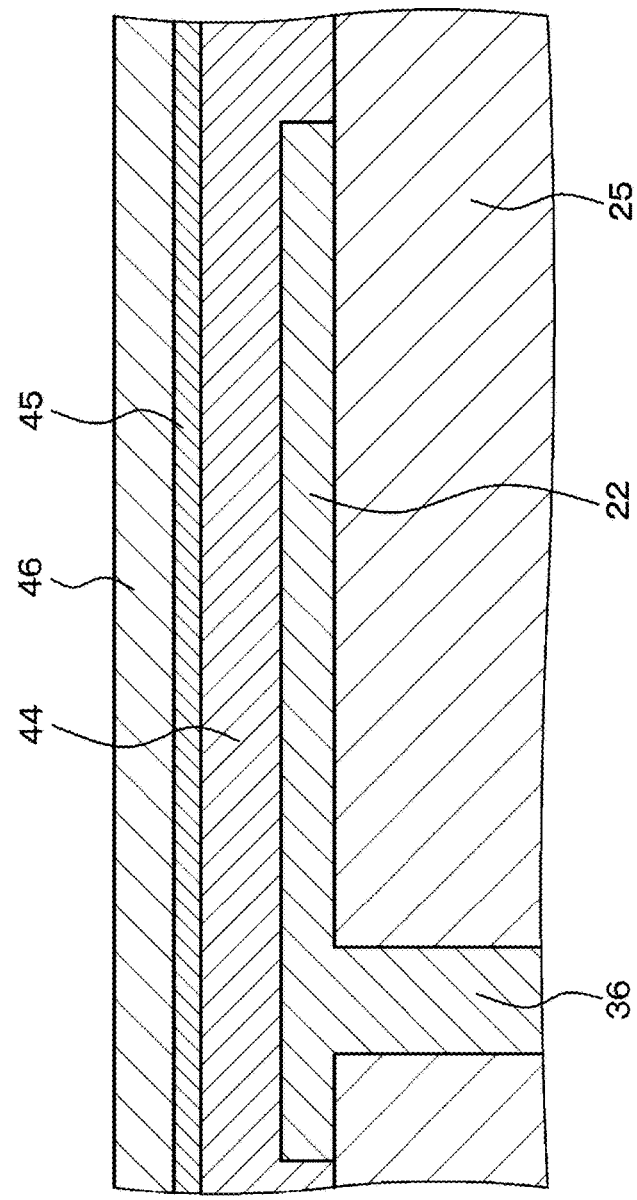
FIG. 5 is a schematic partial cross-sectional view illustrating an interlayer insulation layer and the like for describing the method for manufacturing the display device of the first embodiment, following FIG. 4.
Figure 6:
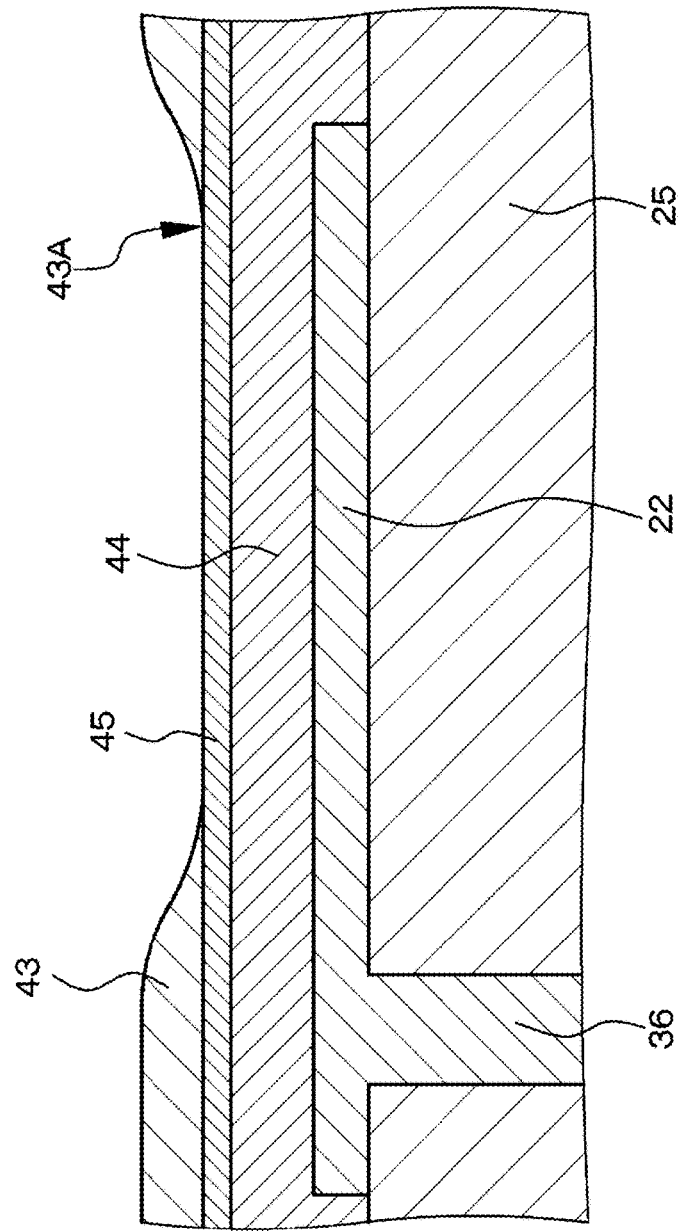
FIG. 6 is a schematic partial cross-sectional view illustrating an interlayer insulation layer and the like for describing the method for manufacturing the display device of the first embodiment, following FIG. 5.

Thereafter, a first insulation layer forming layer 44, a second insulation layer forming layer 45, and a third insulation layer forming layer 46 are sequentially formed on the entire surface according to a CVD method (see FIG. 5). Subsequently, the third insulation layer forming layer 46 is patterned on the basis of a photolithography technique and an etching technique. Specifically, a resist layer is formed on the third insulation layer forming layer 46, and the resist layer is patterned on the basis of a photolithography technique. Then, the third insulation layer forming layer 46 is anisotropically etched using the patterned resist layer as an etching mask, and then the resist layer is removed. In this way, the structure illustrated in FIG. 6 can be obtained.

Figure 7:
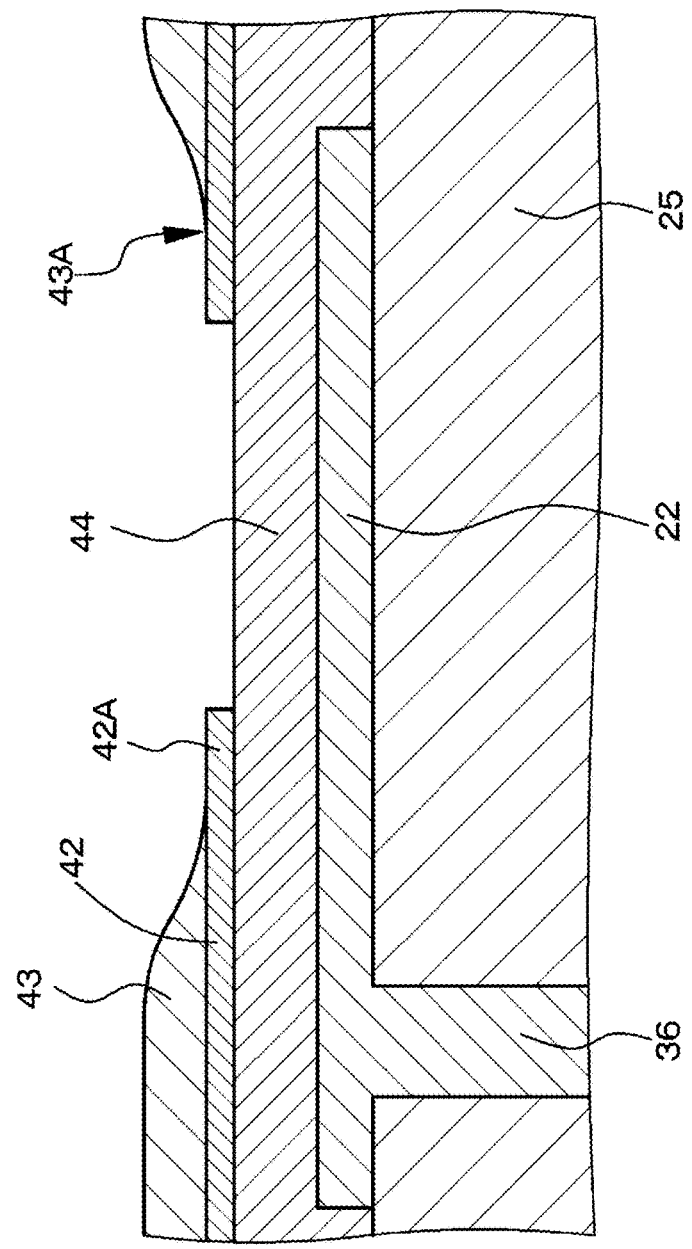
FIG. 7 is a schematic partial cross-sectional view illustrating an interlayer insulation layer and the like for describing the method for manufacturing the display device of the first embodiment, following FIG. 6.

Thereafter, the second insulation layer forming layer 45 is patterned on the basis of a photolithography technique and an etching technique. Specifically, a resist layer is formed on the second insulation layer forming layer 45, and the resist layer is patterned by a photolithography technique. Then, the second insulation layer forming layer 45 is anisotropically etched using the patterned resist layer as an etching mask, and then the resist layer is removed. In this way, the structure illustrated in FIG. 7 can be obtained.

Furthermore, the first insulation layer forming layer 44 is patterned on the basis of a photolithography technique and an etching technique. Specifically, a resist layer is formed on the first insulation layer forming layer 44, and the resist layer is patterned by a photolithography technique. Then, the first insulation layer forming layer 44 is isotropically etched using the patterned resist layer as an etching mask, and then the resist layer is removed. In this way, the structure illustrated in FIG. 2 can be obtained.

[Step-120]

Subsequently, the charge injection/transport layer 51 is formed on the entire surface on the basis of a PVD method such as a vacuum vapor deposition method. At this time, the charge injection/transport layer 51 is cut at the protruding end portion 42A of the second insulation layer 42, or is partially connected with an extremely thin film. As described above, the protruding end portion 42A of the second insulation layer 42 can form the charge injection/transport layer 51 in a reliably separated state for each of the first electrodes 22 (for each of the light emitting elements 11) without separately performing patterning.

[Step-130]

Thereafter, a film of the organic layer 52 is formed on the charge injection/transport layer 51 by a PVD method such as a vacuum vapor deposition method or a sputtering method, or a coating method such as a spin coating method or a die coating method, for example. At this time, apart (for example, a hole transport layer) of the organic layer 52 may be cut by the protruding end portion 42A. However, FIG. 1 illustrates a state in which the entire organic layer 52 is connected without being cut.

[Step-140]

Subsequently, the second electrode 24 is formed on the entire surface of the organic layer 52 on the basis of a vacuum vapor deposition method, for example. In this way, films of the organic layer 52 and the second electrode 24 can be continuously formed on the first electrode 22, for example, in a vacuum atmosphere. Thereafter, the protective film 26 is formed on the entire surface by a CVD method or a PVD method, for example. Finally, the protective film 26 and the second electrode 22 are bonded to each other via the resin layer (sealing resin layer) 27. Note that the color filters 12R, 12G, and 12B and the black matrix layer 13 are formed in advance on the second substrate 23. Then, a surface on which the color filter 12 is formed is used as a bonding surface. In this way, the organic EL display device illustrated in FIG. 1 can be obtained.

As described above, in the first embodiment, the protruding end portion 42A protruding from the aperture portion 41A (that is, the protruding end portion 42A protruding from the first insulation layer 41 and the third insulation layer 43) is disposed in the second insulation layer 42 sandwiched by the first insulation layer 41 and the third insulation layer 43. Therefore, at least a part of the charge injection/transport layer 51 formed over the second insulation layer 42 and the third insulation layer 43 from the first electrode 22 is reliably discontinuous at the protruding end portion 42A. That is, the charge injection/transport layer 51 is reliably cut at the protruding end portion 42A of the second insulation layer 42 or the resistance thereof is increased, and therefore occurrence of a phenomenon that a leakage current flows between the first electrode 22 of a certain light emitting element and the second electrode 24 constituting an adjacent light emitting element can be reliably prevented. In addition, the chromaticity of the entire pixels does not deviate from a desired chromaticity, and the chromaticity of white light emitted from the white light emitting element can be improved.

Second Embodiment

The second embodiment is a modification of the first embodiment. In a light emitting element of the second embodiment, a material constituting the first insulation layer 41 is different from a material constituting the second insulation layer 42 and a material constituting the third insulation layer 43, and the material constituting the second insulation layer 42 and the material constituting the third insulation layer 43 are the same as each other. Specifically, the insulation layers 41, 42, and 43 are constituted by a material in which the second insulation layer 42 and the third insulation layer 43 are hardly etched when the first insulation layer 41 is etched, and a material in which the first insulation layer 41 is hardly etched when the second insulation layer 42 and the third insulation layer 43 are etched. More specifically, the material constituting the first insulation layer 41 is formed of SiN, and the material constituting the second insulation layer 42 and the third insulation layer 43 is formed of SiO$_2$. The configurations and structures of the display device and the light emitting element of the second embodiment can be similar to those of the display device and the light emitting element of the first embodiment except for the above points, and therefore detailed description will be omitted.

Hereinafter, the outline of a method for manufacturing the organic EL display device of the second embodiment will be described.

[Step-200]

First, in a similar manner to [Step-100] of the first embodiment, a light emitting element driving unit is formed on a silicon semiconductor substrate (first substrate 21) on the basis of a known MOSFET manufacturing process, and then an interlayer insulation layer 25 and a first electrode 22 are formed.

[Step-210]

Figure 8:
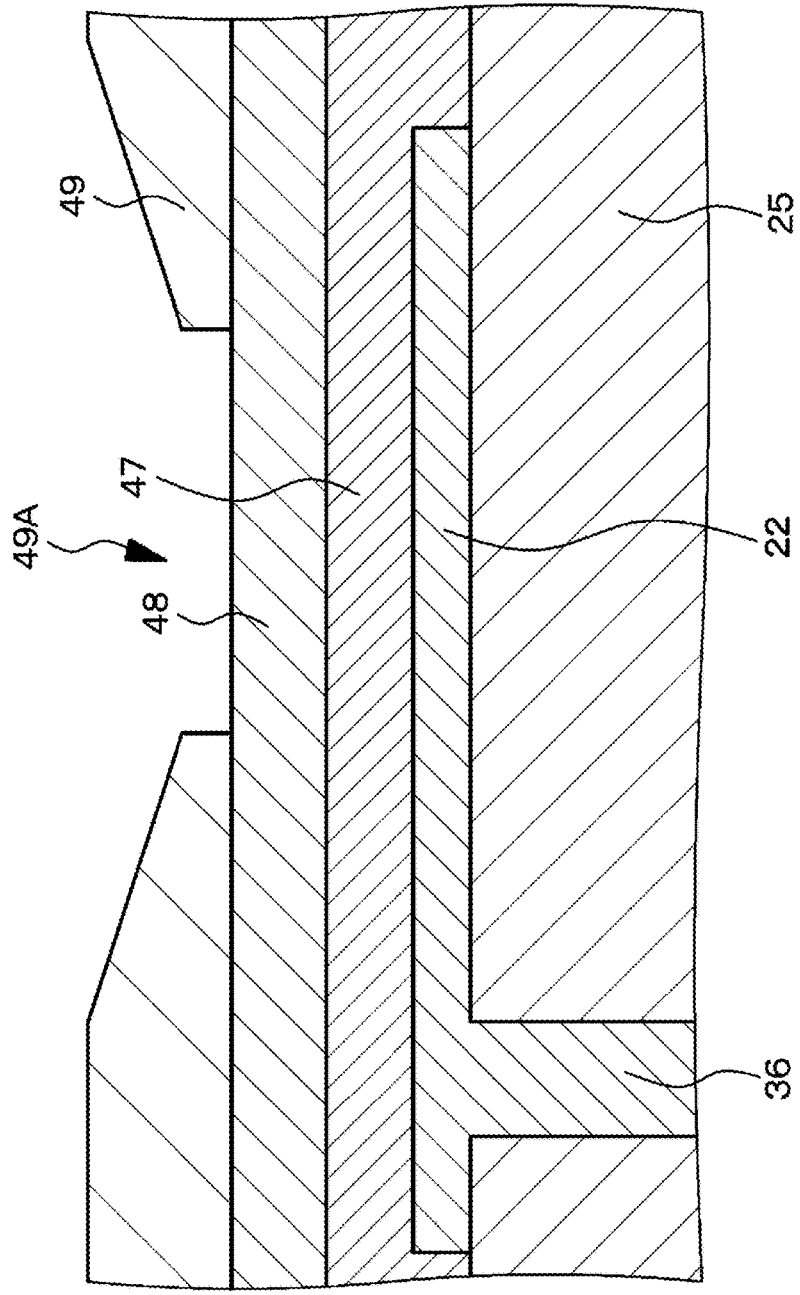
FIG. 8 is a schematic partial cross-sectional view illustrating an interlayer insulation layer and the like for describing a method for manufacturing a display device of a second embodiment.
Figure 9:
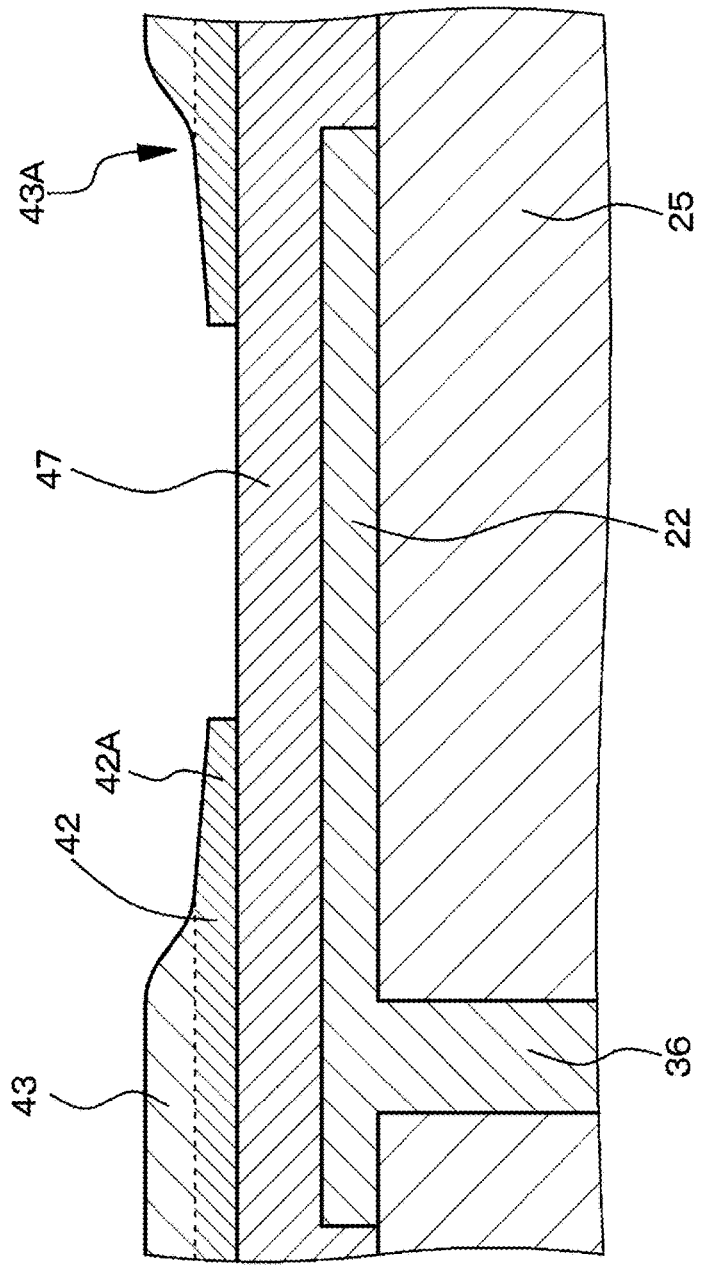
FIG. 9 is a schematic partial cross-sectional view illustrating an interlayer insulation layer and the like for describing the method for manufacturing the display device of the second embodiment, following FIG. 8.

Thereafter, a first insulation layer forming layer 47 and a second/third insulation layer forming layer 48 are sequentially formed on the entire surface according to a CVD method. Subsequently, a resist layer 49 is formed on the second/third insulation layer forming layer 48, and the resist layer is patterned by a photolithography technique to form a forward tapered resist layer 49 having an aperture portion 49A (see FIG. 8). Then, the second/third insulation layer forming layer 48 is anisotropically etched using the patterned resist layer 49 as an etching mask, and then the resist layer is removed. In this way, the structure illustrated in FIG. 9 can be obtained.

Figure 10:
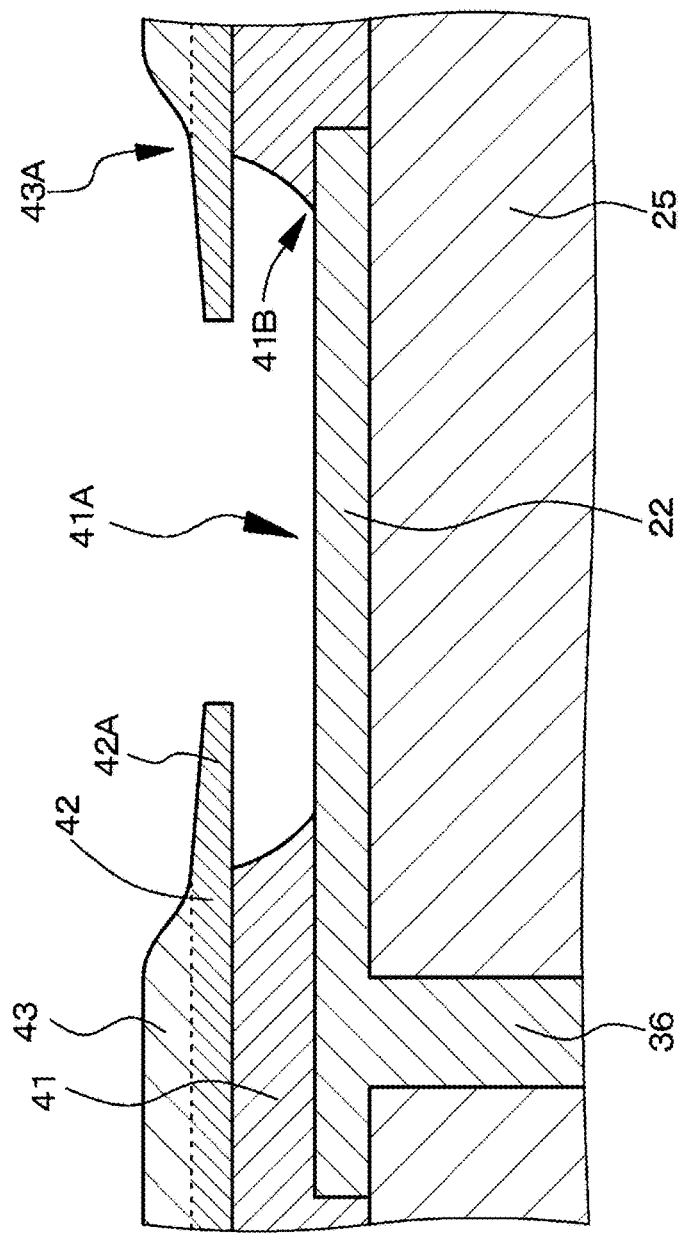
FIG. 10 is a schematic partial cross-sectional view illustrating an interlayer insulation layer and the like for describing the method for manufacturing the display device of the second embodiment, following FIG. 9.

Thereafter, the first insulation layer forming layer 47 is patterned on the basis of a photolithography technique and an etching technique. Specifically, a resist layer is formed on the first insulation layer forming layer 47, and the resist layer is patterned by a photolithography technique. Then, the first insulation layer forming layer 47 is isotropically etched using the patterned resist layer as an etching mask, and then the resist layer is removed. In this way, the structure illustrated in FIG. 10 can be obtained.

[Step-220]

Subsequently, by performing similar steps to [Step-120], [Step-130], and [Step-140] of the first embodiment, the organic EL display device of the second embodiment can be obtained.

As described above, even in the second embodiment, the protruding end portion 42A protruding from the aperture portion 41A (that is, the protruding end portion 42A protruding from the first insulation layer 41 and the third insulation layer 43) is disposed in the second insulation layer 42 sandwiched by the first insulation layer 41 and the third insulation layer 43. Therefore, at least a part of the charge injection/transport layer 51 formed over the second insulation layer 42 and the third insulation layer 43 from the first electrode 22 is reliably discontinuous at the protruding end portion 42A. That is, the charge injection/transport layer 51 is reliably cut at the protruding end portion 42A of the second insulation layer 42 or the resistance thereof is increased, and therefore occurrence of a phenomenon that a leakage current flows between the first electrode 22 of a certain light emitting element and the second electrode 24 constituting an adjacent light emitting element can be reliably prevented. In addition, the chromaticity of the entire pixels does not deviate from a desired chromaticity, and the chromaticity of white light emitted from the white light emitting element can be improved.

Figure 11:
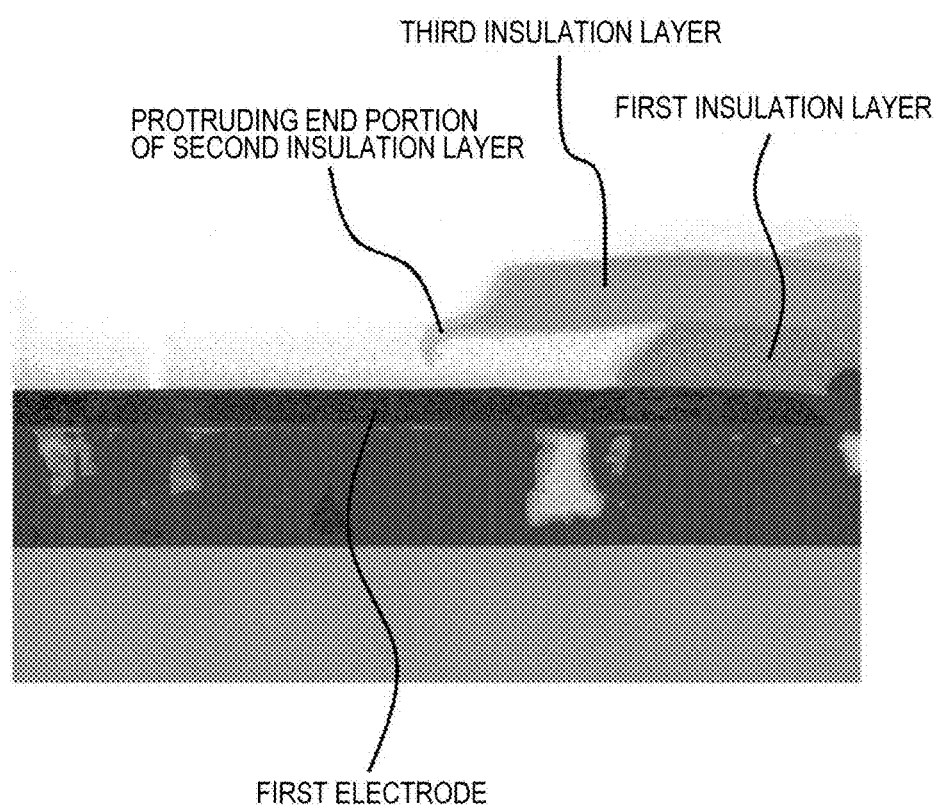
FIG. 11 is a cross-sectional photograph of a first electrode and the like constituting a light emitting element in a process of manufacturing the display device of the second embodiment.

FIG. 11 illustrates a cross-sectional photograph of the first electrode or the like constituting the light emitting element at the time when [Step-210] is completed. The tip portion of the protruding end portion 42A of the second insulation layer 42 is bent slightly downward when a sample for photographing is prepared. However, it is clearly found that the protruding end portion 42A protruding from the aperture portion 41A is disposed in the second insulation layer 42 sandwiched by the first insulation layer 41 and the third insulation layer 43.

Hitherto, the present disclosure has been described on the basis of the preferable embodiments. However, the present disclosure is not limited to these embodiments. The configurations and structures of the display device, the organic EL display device, the light emitting element, and the organic EL element described in the embodiments are illustrative and can be changed appropriately. The first insulation layer may be constituted by two layers of a lower first insulation layer and an upper first insulation layer, the lower first insulation layer that is the part of the interlayer insulation layer 25 exposed between the first electrode 22 and the first electrode 22 may be formed, and the flat upper first insulation layer may be formed on the lower first insulation layer and an edge portion of the first electrode. In the embodiment, a sub-pixel is constituted exclusively by combining a white light emitting element with a color filter. Alternatively, one pixel may be constituted by three sub-pixels (light emitting elements) of a sub-pixel having a red light emitting layer and constituted by a light emitting element that emits red light, a sub-pixel having a green light emitting layer and constituted by a light emitting element that emits green light, and a sub-pixel having a blue light emitting layer and constituted by a light emitting element that emits blue light.

Note that the present disclosure may have the following configurations.

[A01]<<Light Emitting Element>>

A light emitting element including:

a first electrode formed on a base body;

a first insulation layer formed on the base body and the first electrode and having an aperture portion in which a part of the first electrode is exposed;

a second insulation layer formed on the first insulation layer and having a protruding end portion protruding from the aperture portion disposed in the first insulation layer;

a third insulation layer formed on the second insulation layer and having an end portion recessed from the protruding end portion of the second insulation layer;

a charge injection/transport layer formed over the second insulation layer and the third insulation layer from the first electrode;

an organic layer formed on the charge injection/transport layer and including a light emitting layer formed of an organic light emitting material; and a second electrode formed on the organic layer, in which at least apart of the charge injection/transport layer is discontinuous at the protruding end portion of the second insulation layer.

[A02] The light emitting element according to [A01], in which top surfaces of the second insulation layer and the third insulation layer in a region beyond the third insulation layer from the protruding end portion of the second insulation layer are gentle.

[A03] The light emitting element according to [A01] or [A02], in which a material constituting the first insulation layer, a material constituting the second insulation layer, and a material constituting the third insulation layer are different from one another.

[A04] The light emitting element according to [A01] or [A02], in which a material constituting the first insulation layer is different from a material constituting the second insulation layer and a material constituting the third insulation layer, and the material constituting the second insulation layer and the material constituting the third insulation layer are the same as each other.

[A05] The light emitting element according to any one of [A01] to [A04], in which the resistance of the charge injection/transport layer is increased due to discontinuity in at least a part of the charge injection/transport layer at the protruding end portion of the second insulation layer.

[A06] The light emitting element according to any one of [A01] to [A05], in which the thickness of the second insulation layer above the first electrode is smaller than the thicknesses of the first insulation layer and the third insulation layer above the first electrode.

[A07] The light emitting element according to any one of [A01] to [A06], in which the light emitting layer is constituted by at least two light emitting layers that emit different colors.

[A08] The light emitting element according to [A07], in which light emitted from the organic layer is white.

[A09] The light emitting element according to any one of [A01] to [A08], in which the charge injection/transport layer exhibits at least one of a charge injection property and a charge transport property.

[A10] The light emitting element according to any one of [A01] to [A09], in which the base body is formed of a silicon semiconductor substrate on which a transistor is formed and an interlayer insulation layer formed thereon, the first electrode and the first insulation layer are formed on the interlayer insulation layer, and the first electrode is connected to the transistor formed on the silicon semiconductor substrate via a contact hole formed in the interlayer insulation layer.

[B01]<<Display Device>>

A display device in which a plurality of the light emitting elements according to any one of [A01] to [A10] is arranged in a two-dimensional matrix.

[B02] The display device according to [B01], in which the first insulation layer, the second insulation layer, the third insulation layer, the charge injection/transport layer, the organic layer, and the second electrode are common in the plurality of light emitting elements.

REFERENCE SIGNS LIST

10 Image display unit
11 Light emitting element
11R Red light emitting element
11G Green light emitting element
11B Blue light emitting element
12R Red color filter
12G Green color filter
12B Blue color filter
13 Black matrix layer
21 First substrate
22 First electrode
23 Second substrate
24 Second electrode
25 Interlayer insulation layer
26 Protective film
27 Resin layer (sealing resin layer)
30 Transistor (MOSFET)
31 Gate electrode
32 Gate insulation layer
33 Channel formation region
34 Source/drain region
35 Element isolation region
36 Contact hole
41 First insulation layer
42 Aperture portion disposed in first insulation layer
42A Edge portion of aperture portion
43 Second insulation layer
42A Protruding end portion
43 Third insulation layer
43A End portion of third insulation layer
44, 47 First insulation layer forming layer
45 Second insulation layer forming layer
46 Third insulation layer forming layer
48 Second/third insulation layer forming layer
49 Resist layer
49A Aperture portion disposed in resist layer
51 Charge injection/transport layer
52 Organic layer

The invention claimed is:

1. A light emitting element comprising:
a first electrode formed on a base body;
a first insulation layer formed on the base body and the first electrode and having an aperture portion in which a part of the first electrode is exposed;
a second insulation layer formed on the first insulation layer and having a protruding end portion protruding from the aperture portion disposed in the first insulation layer;
a third insulation layer formed on the second insulation layer and having an end portion recessed from the protruding end portion of the second insulation layer;
a charge injection/transport layer formed over the second insulation layer and the third insulation layer from the first electrode;
an organic layer formed on the charge injection/transport layer and including a light emitting layer formed of an organic light emitting material; and
a second electrode formed on the organic layer, wherein
at least a part of the charge injection/transport layer is discontinuous at the protruding end portion of the second insulation layer.

2. The light emitting element according to claim 1, wherein top surfaces of the second insulation layer and the third insulation layer in a region beyond the third insulation layer from the protruding end portion of the second insulation layer are gentle.

3. The light emitting element according to claim 1, wherein a material constituting the first insulation layer, a material constituting the second insulation layer, and a material constituting the third insulation layer are different from one another.

4. The light emitting element according to claim 1, wherein a material constituting the first insulation layer is different from a material constituting the second insulation layer and a material constituting the third insulation layer, and the material constituting the second insulation layer and the material constituting the third insulation layer are the same as each other.

5. The light emitting element according to claim 1, wherein the resistance of the charge injection/transport layer is increased due to discontinuity in at least a part of the charge injection/transport layer at the protruding end portion of the second insulation layer.

6. The light emitting element according to claim 1, wherein the thickness of the second insulation layer above the first electrode is smaller than each of the thicknesses of the first insulation layer and the third insulation layer above the first electrode.

7. The light emitting element according to claim 1, wherein the light emitting layer is constituted by at least two light emitting layers that emit different colors.

8. The light emitting element according to claim 7, wherein light emitted from the organic layer is white.

9. The light emitting element according to claim 1, wherein the charge injection/transport layer exhibits at least one of a charge injection property and a charge transport property.

10. The light emitting element according to claim 1, wherein
the base body is formed of a silicon semiconductor substrate on which a transistor is formed and an interlayer insulation layer formed thereon,
the first electrode and the first insulation layer are formed on the interlayer insulation layer, and
the first electrode is connected to the transistor formed on the silicon semiconductor substrate via a contact hole formed in the interlayer insulation layer.

11. A display device comprising:
a plurality of the light emitting elements arranged in a two-dimensional matrix, each of the plurality of light emitting elements comprising:
a first electrode formed on a base body;
a first insulation layer formed on the base body and the first electrode and having an aperture portion in which a part of the first electrode is exposed;
a second insulation layer formed on the first insulation layer and having a protruding end portion protruding from the aperture portion disposed in the first insulation layer;
a third insulation layer formed on the second insulation layer and having an end portion recessed from the protruding end portion of the second insulation layer;
a charge injection/transport layer formed over the second insulation layer and the third insulation layer from the first electrode;
an organic layer formed on the charge injection/transport layer and including a light emitting layer formed of an organic light emitting material; and
a second electrode formed on the organic layer, wherein
at least a part of the charge injection/transport layer is discontinuous at the protruding end portion of the second insulation layer.

12. The display device according to claim 11, wherein the first insulation layer, the second insulation layer, the third insulation layer, the charge injection/transport layer, the organic layer, and the second electrode are common in the plurality of light emitting elements.

13. The display device according to claim 11, wherein top surfaces of the second insulation layer and the third insulation layer in a region beyond the third insulation layer from the protruding end portion of the second insulation layer are gentle.

14. The display device according to claim 11, wherein a material constituting the first insulation layer, a material constituting the second insulation layer, and a material constituting the third insulation layer are different from one another.

15. The display device according to claim 11, wherein a material constituting the first insulation layer is different from a material constituting the second insulation layer and a material constituting the third insulation layer, and the material constituting the second insulation layer and the material constituting the third insulation layer are the same as each other.

16. The display device according to claim 11, wherein the resistance of the charge injection/transport layer is increased due to discontinuity in at least a part of the charge injection/transport layer at the protruding end portion of the second insulation layer.

17. The display device according to claim 11, wherein the thickness of the second insulation layer above the first electrode is smaller than each of the thicknesses of the first insulation layer and the third insulation layer above the first electrode.

18. The display device according to claim 11, wherein the light emitting layer is constituted by at least two light emitting layers that emit different colors.

19. The display device according to claim 18, wherein light emitted from the organic layer is white.

20. The display device according to claim 11, wherein the charge injection/transport layer exhibits at least one of a charge injection property and a charge transport property.

* * * * *